(12) United States Patent
Tsai

(10) Patent No.: US 8,054,935 B2
(45) Date of Patent: Nov. 8, 2011

(54) SHIFT REGISTER WITH LOW POWER CONSUMPTION

(75) Inventor: Tsung-Ting Tsai, Hsinchu (TW)

(73) Assignee: AU Optronics Corporation, Hsinchu (TW)

( * ) Notice: Subject to any disclaimer, the term of this patent is extended or adjusted under 35 U.S.C. 154(b) by 10 days.

(21) Appl. No.: 12/617,869

(22) Filed: Nov. 13, 2009

(65) Prior Publication Data

US 2011/0116592 A1     May 19, 2011

(51) Int. Cl.
*G11C 19/00*     (2006.01)

(52) U.S. Cl. .................. 377/64; 377/68; 377/78; 377/79

(58) Field of Classification Search .................. None
See application file for complete search history.

(56) References Cited

U.S. PATENT DOCUMENTS

| | | | |
|---|---|---|---|
| 6,747,627 B1 * | 6/2004 | Koyama et al. ............... | 345/100 |
| 6,970,530 B1 * | 11/2005 | Wang et al. ................... | 377/69 |
| 7,203,264 B2 * | 4/2007 | Lo et al. ........................ | 377/64 |
| 7,406,146 B2 * | 7/2008 | Yu .................................. | 377/64 |
| 7,436,923 B2 | 10/2008 | Tobita | |
| 7,894,566 B2 * | 2/2011 | Hsiao et al. .................... | 377/64 |
| 2005/0018807 A1 | 1/2005 | Han et al. | |
| 2007/0217563 A1 * | 9/2007 | Chang et al. .................. | 377/64 |
| 2007/0274432 A1 * | 11/2007 | Yu .................................. | 377/64 |
| 2007/0274433 A1 * | 11/2007 | Tobita ............................ | 377/64 |
| 2008/0101529 A1 * | 5/2008 | Tobita ............................ | 377/64 |
| 2009/0122951 A1 | 5/2009 | Tobita | |
| 2009/0303211 A1 * | 12/2009 | Hu ................................. | 345/204 |

FOREIGN PATENT DOCUMENTS

EP     2099018 A1     9/2009

* cited by examiner

*Primary Examiner* — Tuan T Lam

(74) *Attorney, Agent, or Firm* — Morris Manning Martin LLP; Tim Tingkang Xia, Esq.

(57) ABSTRACT

A shift register comprising a plurality of shift register stages $\{S_N\}$, N=1, 2, ..., M, M being a nonzero positive integer. Each of the plurality of shift register stages, $S_N$, comprises a first input, a second input, a third input for receiving a first clock signal CK, a fourth input for receiving a second clock signal XCK, an output for providing an output signal OUT (N), therefrom. The plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

19 Claims, 10 Drawing Sheets

US 8,054,935 B2

SHIFT REGISTER WITH LOW POWER CONSUMPTION

CROSS-REFERENCE TO RELATED PATENT APPLICATION

Some references, which may include patents, patent applications and various publications, are cited and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference were individually incorporated by reference.

FIELD OF THE INVENTION

The present disclosure relates generally to a shift register, and more particularly, to a shift register with low power consumption for a display.

BACKGROUND OF THE INVENTION

A shift register circuit has been of widespread applications in electronic devices such as a liquid crystal display (LCD), an electroluminescence display, or an organic light emitting diode display, and so on.

FIG. 9 shows a conventional bidirectional shift register as disclosed by U.S. Pub. No. 2009/0122951 to Tobita. The shift register $SR_k$ has three circuits with each having a function as a shift register at one stage, i.e., a gate line drive unit 41, a forward shift unit 42, and a backward shift unite 43. The gate line driver 41 is provided with an inverter having the node N1 as its input end. The inverter is composed of a capacitive element C2 and a transistor Q6 and it is a capacitive load type inverter in which the capacitive element C2 is a load element. It is noted that this inverter differs from a normal inverter in that the clock signal to be inputted to the first clock terminal CK1 is supplied as a power supply. That is, the transistor Q1 is a transistor to supply the clock signal inputted to the first clock terminal CK1 to the output terminal OUT.

Although the forward shift unit 42 itself does not include the inverter in this embodiment, the output of the inverter composed of the capacitive element C2 and the transistor Q6 of the gate line drive unit 41 is shared by the forward shift unit 42. That is, the transistor Q2A$n$ is connected to the node N2 serving as the output end of the inverter in the gate line drive unit 41. In addition, the gate of a transistor Q5$n$ connected between the node N1$n$ and the first power supply terminal S1 is connected to the node N2. The gate of the transistor Q2B$n$ is connected to the second clock terminal CK2.

Meanwhile, transistors Q1$r$, Q2A$r$ and Q2B$r$ are connected to the backward output terminal OUTr of the backward shift unit 43. The transistor Q1$r$ is connected between the backward output terminal OUTr and the first backward clock terminal CK1$r$. That is, the transistor Q1$r$ is a transistor to supply the clock signal inputted to the first backward clock terminal CK1$r$ to the backward output terminal OUTr. Both transistors Q2A$r$ and Q2B$r$ are connected between the backward output terminal OUTr and the first power supply terminal S1. Thus, transistors Q2A$r$ and Q2B$r$ function to discharge the backward output terminal OUTr. Here, the gate node of the transistor Q1$r$ is defined as "node N1$r$".

A capacitive element C1$r$ is provided between the gate and the source of the transistor Q1$r$, that is, between the node N1$r$ and the backward output terminal OUTr. The capacitive element C1$r$ enhances the boosting effect of the node N1$r$ so as to correspond to the level rise of the backward output terminal OUTr. When the capacity between the gate and the channel of the transistor Q1$r$ is sufficiently high, the capacitive element C1$r$ may be also replaced by it and omitted.

Although the backward shift unit 43 also does not include the inverter, the output of the inverter of the gate line drive unit 41 is shared by the backward shift unit 43. That is, the transistor Q2A$r$ is connected to the node N2 serving as the output end of the inverter in the gate line drive unit 41. The gate of a transistor Q5$r$ connected between the node N1$r$ and the first power supply terminal S1 is also connected to the node N2. The gate of the transistor Q2B$r$ is connected to the second clock terminal CK2.

FIG. 10 shows a conventional bidirectional unite shift register as disclosed by U.S. Pat. No. 7,436,923 to Tobita. In the bidirectional unit shift register, an output stage of the unit shift register SR is constituted by a transistor Q1 connected between the output terminal OUT and the first clock terminal CK1; and transistors Q2 and Q8 both connected between the output terminal OUT and the first power supply terminal S1. In other words, the transistor Q1 is a transistor that supplies a clock signal inputted to the first clock terminal CK1 to the output terminal OUT, and the transistors Q2 and Q8 are transistors that supply a potential at the first Power supply terminal S1 to the output terminal OUT thereby to discharge the output terminal OUT.

The first voltage signal Vn and the second voltage signal Vr are complementary to each other in such a manner that their levels are switched according to the direction of shift of the signals. Specifically, the first voltage signal Vn becomes HIGH level and the second voltage signal Vr becomes LOW level for a forward shift, while the second voltage signal Vr becomes HIGH level and the first voltage signal becomes LOW level for a backward shift.

The node N1 is connected to first and second pull-down circuits 41 and 42 that discharge the node N1. These first and second pull-down circuits 41 and 42 operate in such a manner that they discharge the node N1 during the non-selected period of the unit shift register SR (during the period when the node N1 is not charged), and that they do not discharge the node N1 during the period (selected period) when the unit shift register SR is selected (during the period when the node N1 is charged).

The first pull-down circuit 41 includes transistors Q5A and Q7A and a capacitive element C2A, and similarly, the second pull-down circuit 42 includes transistors Q5B and Q7B and a capacitive element C2B.

In the first pull-down circuit 41, the transistor Q5A is connected between the node N1 and the first power supply terminal S1. Herein, a node connected to the gate of the transistor Q5A is defined as a "node N3." The transistor Q7A is connected between this node N3 and the first power supply terminal S1 so that its gate is connected to the node N1. The capacitive element C2A is connected between the node N3 and the first clock terminal CK1.

The capacitive element C2A and the transistor Q7A form an inverter using the node N1 as the input end and the node N3 as the output end. That is, this inverter is an inverter with capacitive load, using the capacitive element C2A as its load element, and its output is inputted to the gate of the aforementioned transistor Q5A. However, this inverter differs from traditional ones in that its power supply is a clock signal inputted to the first clock terminal CK1. That is, this inverter operates in an alternating manner by being activated by a clock signal inputted to the first clock terminal CK1. Thus, the capacitive element C2A serves not only as the load element of the inverter but also as a coupling capacitance between the output end of the inverter and the first clock terminal CK1.

The second pull-down circuit 42 has a similar configuration to the aforementioned first pull-down circuit 41. The transistor Q5B is connected between the node N1 and the first power supply terminal S1. Herein, a node connected to the gate of the transistor Q5B is defined as a "node N4." The transistor Q7B is connected between the node N4 and the first power supply terminal S1 so that its gate is connected to the node N1. The capacitive element C2B is connected between the node N4 and the second clock terminal CK2.

The capacitive element C2B and the transistor Q7B form an inverter using the node N1 as the input end and the node N4 as the output end. In other words, this inverter is an inverter with capacitive load, using the capacitive element C2B as its load element, and its output is inputted to the gate of the aforementioned transistor Q5B. However, this inverter differs from traditional ones in that its power supply is a clock signal inputted to the second clock terminal CK2. That is, this inverter operates in an alternating manner by being activated by a clock signal inputted to the second clock terminal CK2. Thus, the capacitive element C2B serves not only as the load element of the inverter but also as a coupling capacitance between the output end of the inverter and the second clock terminal CK2.

However, such conventional bidirectional unite shift registers may cause large power consumption due to following reasons. Firstly, both of the two bidirectional unite shift registers include an inverter structure or the like which may result in larger power consumption. Secondly, as the gate of the transistors Q1 is connected to the first clock terminal CK1 for receiving the clock signal inputted and the drain of the transistors Q1 is connected to the output terminal OUT for outputting signals, the output terminal will be vulnerable to clock coupling effect, which may result in larger power consumption and unstable outputting wave form.

Therefore, a heretofore unaddressed need exists in the art to address the aforementioned deficiencies and inadequacies.

SUMMARY OF THE INVENTION

In one aspect, the present invention relates to a shift register comprising a plurality of shift register stages $\{S_N\}$, N=1, 2, ..., M, M being a nonzero positive integer. In one embodiment, each of the plurality of shift register stages, $S_N$, comprises a first input, a second input, a third input for receiving a first clock signal, CK, a fourth input for receiving a second clock signal, XCK, a fifth input for receiving a first supply voltage, VDD, a sixth input for receiving a second supply voltage, VSS, and an output for providing an output signal, OUT(N), therefrom.

In one embodiment, each of the first clock signal CK and the second clock signal XCK is characterized with a frequency and a phase, and wherein the frequency of the first clock signal CK is identical to that of the second clock signal XCK, and the phase difference between the first clock signal CK and the second clock signal XCK is about 180°. The first supply voltage VDD is at a high voltage level, and the second supply voltage VSS is at a low voltage level.

Furthermore, each of the plurality of shift register stages $S_N$ comprises a first transistor T1 having a gate electrically connected to the first input, a drain, and a source electrically connected to the gate, a second transistor T2 having a gate electrically connected to the third input, a drain, and a source electrically connected to the drain of the first transistor T1, a third transistor T3 having a gate electrically connected to the drain of the second transistor T2, a drain electrically connected to the fifth input, and a source electrically connected to the output, a fourth transistor T4 having a gate electrically connected to the second input, a drain electrically connected to the drain of the first transistor T1, and a source electrically connected to the sixth input, a fifth transistor T5 having a gate electrically connected to the fourth input, a drain electrically connected to the drain of the second transistor T2, and a source electrically connected to the sixth input, a sixth transistor T6 having a gate electrically connected to the gate of the fifth transistor T5, a drain electrically connected to the output OUT, and a source electrically connected to the sixth input, a first capacitor C1 electrically connected between the source of the second transistor T2 and the output, and a second capacitor C2 electrically connected between the gate of the third transistor T3 and the output. At least one of the first to sixth transistors T1-T6 includes a MOS thin film transistor In one embodiment, the plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

In anther aspect, the present invention relates to a shift register comprising a plurality of shift register stages $\{S_N\}$, N=1, 2, ..., M, M being a nonzero positive integer. In one embodiment, each of the plurality of shift register stages, $S_N$, comprises a first input, a second input, a third input for receiving a first clock signal, CK, a fourth input for receiving a second clock signal, XCK, a fifth input for receiving a first supply voltage, VDD, a sixth input for receiving a second supply voltage, VSS, and an output for providing an output signal, OUT(N), therefrom.

In one embodiment, each of the first clock signal CK and the second clock signal XCK is characterized with a frequency and a phase, and wherein the frequency of the first clock signal CK is identical to that of the second clock signal XCK, and the phase difference between the first clock signal CK and the second clock signal XCK is about 180°. The first supply voltage VDD is at a high voltage level, and the second supply voltage VSS is at a low voltage level.

Each of the plurality of shift register stages $S_N$ also comprises a first transistor T1 having a gate, a drain, and a source electrically connected to the gate, a second transistor T2 having a gate electrically connected to the third input, a drain, and a source electrically connected to the drain of the first transistor T1, a third transistor T3 having a gate electrically connected to the drain of the second transistor T2, a drain electrically connected to the fifth input, and a source electrically connected to the output, a fourth transistor T4 having a gate electrically connected to the second input, a drain electrically connected to the drain of the first transistor T1, and a source electrically connected to the sixth input, a fifth transistor T5 having a gate electrically connected to the fourth input, a drain electrically connected to the drain of the second transistor T2, and a source electrically connected to the sixth input, a sixth transistor T6 having a gate electrically connected to the gate of the fifth transistor T5, a drain electrically connected to the output OUT, and a source electrically connected to the sixth input, a seventh transistor T7 having a gate electrically connected to the gate of the first transistor T1, a drain electrically connected to the source of the first transistor T1, and a source electrically connected to the first input, an eighth transistor T8 having a gate electrically connected to the output OUT, a drain electrically connected to the source of the first transistor T1, and a source electrically connected to the gate, a first capacitor C1 electrically connected between the source of the second transistor T2 and the output, and a second capacitor C2 electrically connected between the gate of the third transistor T3 and the output. At least one of the first to eighth transistors T1-T8 comprises a MOS thin film transistor.

As arranged, the plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

In yet another aspect, the present invention relates to a shift register comprising a plurality of shift register stages $\{S_N\}$, N=1, 2, . . . , M, M being a nonzero positive integer. In one embodiment, each of the plurality of shift register stages, $S_N$, comprises a first input, a second input, a third input for receiving a first clock signal, CK, a fourth input for receiving a second clock signal, XCK, a fifth input for receiving a first supply voltage, VDD, a sixth input for receiving a second supply voltage, VSS, and an output for providing an output signal, OUT(N), therefrom.

In one embodiment, each of the first clock signal CK and the second clock signal XCK is characterized with a frequency and a phase, and wherein the frequency of the first clock signal CK is identical to that of the second clock signal XCK, and the phase difference between the first clock signal CK and the second clock signal XCK is about 180°. The first supply voltage VDD is at a high voltage level, and the second supply voltage VSS is at a low voltage level.

Additionally, each of the plurality of shift register stages $S_N$ also comprises a first transistor T1 having a gate electrically connected to the first input, a drain, and a source electrically connected to the gate, a second transistor T2 having a gate electrically connected to the third input, a drain, and a source electrically connected to the drain of the first transistor T1, a third transistor T3 having a gate electrically connected to the drain of the second transistor T2, a drain electrically connected to the fifth input, and a source electrically connected to the output, a fourth transistor T4 having a gate electrically connected to the second input, a drain electrically connected to the drain of the first transistor T1, and a source electrically connected to the sixth input, a fifth transistor T5 having a gate, a drain electrically connected to the drain of the second transistor T2, and a source electrically connected to the sixth input, a sixth transistor T6 having a gate electrically connected to the gate of the fifth transistor T5, a drain electrically connected to the output OUT, and a source electrically connected to the sixth input, a seventh transistor T7 having a gate electrically connected to the fourth input, a drain electrically connected to gate of the fifth transistor T5, and a source electrically connected to the source of the fifth transistor T5, an eighth transistor T8 having a gate, a drain electrically connected to the source of the seventh transistor T7, and a source electrically connected to the gate and the fifth input, a first capacitor C1 electrically connected between the source of the second transistor T2 and the output, and a second capacitor C2 electrically connected between the gate of the third transistor T3 and the output.

The plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT (N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

In a further aspect, the present invention relates to shift register comprising a plurality of shift register stages $\{S_N\}$, N=1, 2, . . . , M, M being a nonzero positive integer. Each of the plurality of shift register stages, $S_N$, comprises a first input, a second input, a third input for receiving a first clock signal, CK, a fourth input for receiving a second clock signal, XCK, a fifth input for receiving a first supply voltage, VDD, a sixth input for receiving a second supply voltage, VSS, and an output for providing an output signal, OUT(N), therefrom.

Each of the plurality of shift register stages, $S_N$, further comprises six transistors T1-T6 and two capacitors, C1 and C2. The first transistor T1 has a gate electrically connected to the first input, a drain, and a source electrically connected to the gate. The second transistor T2 has a gate electrically connected to the drain of the first transistor T1, a drain electrically connected to the third input, and a source. The third transistor T3 has a gate electrically connected to the source of the second transistor T2, a drain electrically connected to the fifth input, and a source electrically connected to the output. The fourth transistor T4 has a gate electrically connected to the second input, a drain electrically connected to the drain of the first transistor T1, and a source electrically connected to the sixth input. The fifth transistor T5 has a gate electrically connected to the fourth input, a drain electrically connected to the source of the second transistor T2, and a source electrically connected to the sixth input. The sixth transistor T6 has a gate electrically connected to the gate of the fifth transistor T5, a drain electrically connected to the output OUT, and a source electrically connected to the sixth input. The first capacitor C1 is electrically connected between the gate of the second transistor T2 and the output. The second capacitor C2 electrically connected between the gate of the third transistor T3 and the output.

The plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT (N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

In yet a further aspect, the present invention relates to a shift register comprising a plurality of shift register stages $\{S_N\}$, N=1, 2, . . . , M, M being a nonzero positive integer. In one embodiment, each of the plurality of shift register stages, $S_N$, comprises a first input, a second input, a third input for receiving a first clock signal, CK, a fourth input for receiving a second clock signal, XCK, an output for providing an output signal, OUT(N), therefrom. The plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

In one embodiment, each shift register stage $S_N$ further comprises a fifth input for receiving a first supply voltage, VDD, and a sixth input for receiving a second supply voltage, VSS, where the first supply voltage VDD is at a high voltage level, and the second supply voltage VSS is at a low voltage level.

In one embodiment, each shift register stage $S_N$ further comprises a first transistor T1 having a gate electrically connected to the first input, a drain, and a source, a second transistor T2 having a gate electrically connected to the third input, a drain, and a source electrically connected to the drain of the first transistor T1, a third transistor T3 having a gate electrically connected to the drain of the second transistor T2, a drain electrically connected to the fifth input, and a source electrically connected to the output, a fourth transistor T4 having a gate electrically connected to the second input, a drain electrically connected to the drain of the first transistor T1, and a source electrically connected to the sixth input, a fifth transistor T5 having a gate, a drain electrically connected to the drain of the second transistor T2, and a source electrically connected to the sixth input, a sixth transistor T6 having a gate electrically connected to the gate of the fifth transistor T5, a drain electrically connected to the output OUT, and a source electrically connected to the sixth input, a first capacitor C1 electrically connected between the source of the second transistor T2 and the output, and a second capacitor C2 electrically connected between the gate of the third transistor T3 and the output.

In one embodiment, the source of the first transistor T1 is electrically connected to the gate of the first transistor T1, and wherein the gate of the fifth transistor T5 is electrically connected to the fourth input.

In one embodiment, each shift register stage $S_N$ also comprises a seventh transistor T7 having a gate electrically connected to the gate of the first transistor T1, a drain electrically connected to the source of the first transistor T1, and a source electrically connected to the first input, and an eighth transistor T8 having a gate electrically connected to the output OUT, a drain electrically connected to the source of the first transistor T1, and a source electrically connected to the gate.

In another embodiment, each shift register stage $S_N$ further comprises a seventh transistor T7 having a gate electrically connected to the fourth input, a drain electrically connected to gate of the fifth transistor T5, and a source electrically connected to the source of the fifth transistor T5, and an eighth transistor T8 having a gate, a drain electrically connected to the source of the seventh transistor T7, and a source electrically connected to the gate and the fifth input.

In one embodiment, each of the first clock signal CK and the second clock signal XCK is characterized with a frequency and a phase, and wherein the frequency of the first clock signal CK is identical to that of the second clock signal XCK, and the phase difference between the first clock signal CK and the second clock signal XCK is about 180°.

Alternatively, each shift register stage $S_N$ further comprises a first transistor T1 having a gate electrically connected to the first input, a drain, and a source electrically connected to the gate, a second transistor T2 having a gate electrically connected to the drain of the first transistor T1, a drain electrically connected to the third input, and a source, a third transistor T3 having a gate electrically connected to the source of the second transistor T2, a drain electrically connected to the fifth input, and a source electrically connected to the output, a fourth transistor T4 having a gate electrically connected to the second input, a drain electrically connected to the drain of the first transistor T1, and a source electrically connected to the sixth input, a fifth transistor T5 having a gate electrically connected to the fourth input, a drain electrically connected to the source of the second transistor T2, and a source electrically connected to the sixth input, a sixth transistor T6 having a gate electrically connected to the gate of the fifth transistor T5, a drain electrically connected to the output OUT, and a source electrically connected to the sixth input, a first capacitor C1 electrically connected between the gate of the second transistor T2 and the output, and a second capacitor C2 electrically connected between the gate of the third transistor T3 and the output.

In one aspect, the present invention relates to a shift register comprising a plurality of shift register stages $\{S_N\}$, N=1, 2, . . . , M, M being a nonzero positive integer. Each of the plurality of shift register stages, $S_N$, comprises a first input, a second input, a third input for receiving a first clock signal, CK, a fourth input for receiving a second clock signal, XCK, a fifth input for receiving a first supply voltage, VDD, a sixth input for receiving a second supply voltage, VSS, an output for providing an output signal, OUT(N), therefrom, an input buffer electrically coupled to the first input, a pull-up driving circuit electrically coupled to the third input, the input buffer and the output, a pull-down driving circuit electrically coupled to the second, fourth and sixth inputs and the pull-up driving circuit, and an output buffer electrically coupled to the fifth input, the pull-up driving circuit, the pull-down driving circuit and the output.

The plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

In one embodiment, the input buffer comprises a first transistor T1 having a gate electrically connected to the first input, a drain, and a source electrically connected to the gate.

The pull-down driving circuit comprises a fourth transistor T4 having a gate electrically connected to the second input, a drain electrically connected to the drain of the first transistor T1, and a source electrically connected to the sixth input, and a fifth transistor T5 having a gate electrically connected to the fourth input, a drain electrically connected to the drain of the second transistor T2, and a source electrically connected to the sixth input.

The output buffer comprises a third transistor T3 having a gate electrically connected to the drain of the second transistor T2, a drain electrically connected to the fifth input, and a source electrically connected to the output, and a sixth transistor T6 having a gate electrically connected to the gate of the fifth transistor T5, a drain electrically connected to the output, and a source electrically connected to the source of the fifth transistor T5.

In one embodiment, the pull-up driving circuit comprises a second transistor T2 having a gate electrically connected to the third input, a drain electrically connected to the gate of the third transistor T3, and a source electrically connected to the drain of the first transistor T1, a first capacitor C1 electrically connected between the source of the second transistor T2 and the output, and a second capacitor C2 electrically connected between the drain of the second transistor T2 and the output.

In another embodiment, the pull-up driving circuit comprises a second transistor T2 having a gate electrically connected to the drain of the first transistor T1, a drain electrically connected to the third input, and a source electrically connected to the gate of the third transistor T3, a first capacitor C1 electrically connected between the gate of the second transistor T2 and the output, and a second capacitor C2 electrically connected between the source of the second transistor T2 and the output.

In one embodiment, the shift register of claim 29, wherein at least one of the first to sixth transistors T1-T6 comprises a MOS thin film transistor.

In another aspect, the present invention relates to a shift register comprising a plurality of shift register stages $\{S_N\}$, N=1, 2, ..., M, M being a nonzero positive integer. Each of the plurality of shift register stages, $S_N$, includes a first input, a second input, a third input for receiving a first clock signal, CK, a fourth input for receiving a second clock signal, XCK, a fifth input for receiving a first supply voltage, VDD, a sixth input for receiving a second supply voltage, VSS, and an output for providing an output signal, OUT(N), therefrom.

Each stage $S_N$ also includes a first transistor T1 having a gate electrically connected to the first input, a drain, and a source electrically connected to the gate.

Each stage $S_N$ further includes a pull-up driving circuit that has a first capacitor C1 having a first terminal electrically connected to the drain of the first transistor T1 and a second terminal electrically connected to the output and a second capacitor C2 having a first terminal and a second terminal electrically connected to the output.

In one embodiment, the pull-up driving circuit further has a second transistor T2 having a gate electrically connected to the third input, a drain electrically connected to the first terminal of the second capacitor C2, and a source electrically connected to the first terminal of the first capacitor C1. In another embodiment, the pull-up driving circuit also has a second transistor T2 having a gate electrically connected to the first terminal of the first capacitor C1, a drain electrically connected to the third input, and a source electrically connected to the first terminal of the second capacitor C2.

Additionally, each stage $S_N$ includes a pull-down driving circuit electrically coupled to the second, fourth and sixth inputs and the pull-up driving circuit. In one embodiment, the pull-down driving circuit comprises a fourth transistor T4 having a gate electrically connected to the second input, a drain electrically connected to the drain of the first transistor T1, and a source electrically connected to the sixth input, and a fifth transistor T5 having a gate electrically connected to the fourth input, a drain electrically connected to the first terminal of the second capacitor C2, and a source electrically connected to the sixth input.

Moreover, each stage $S_N$ includes an output buffer electrically coupled to the fifth input, the pull-up driving circuit, the pull-down driving circuit and the output. In one embodiment, the output buffer comprises a third transistor T3 having a gate electrically connected to the first terminal of the second capacitor C2, a drain electrically connected to the fifth input, and a source electrically connected to the output, and a sixth transistor T6 having a gate electrically connected to the fourth input, a drain electrically connected to the output, and a source electrically connected to the sixth input.

The plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

These and other aspects of the present invention will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the invention and, together with the written description, serve to explain the principles of the invention. Wherever possible, the same reference numbers are used throughout the drawings to refer to the same or like elements of an embodiment, and wherein.

DETAILED DESCRIPTION OF THE INVENTION

Figure 1:
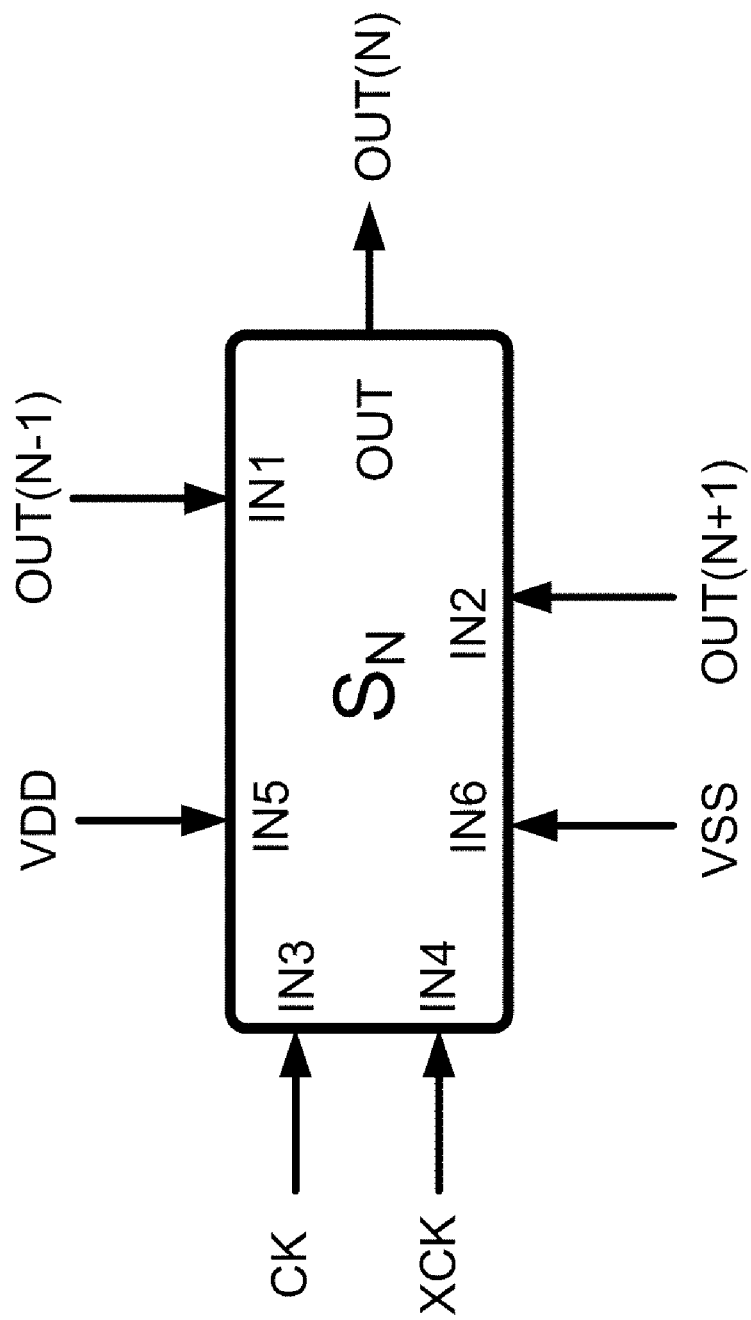
FIG. 1 shows a block diagram of a shift register stage according to one embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise.

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. The use of examples anywhere in this specification, including examples of any terms discussed herein, is illustrative only, and in no way limits the scope and meaning of the invention or of any exemplified term. Likewise, the invention is not limited to various embodiments given in this specification.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising," "including," "having," "containing," "involving," and the like are to be understood to be open-ended, i.e., to mean including but not limited to.

The description will be made as to the embodiments of the present invention in conjunction with the accompanying drawings in FIGS. 1-7. In accordance with the purposes of this disclosure, as embodied and broadly described herein, this disclosure, in one aspect, relates to a shift register with low power consumption.

Referring now to FIG. 1, a shift register stage $S_N$ is shown according to one embodiment of the present invention. The shift register stage $S_N$ has a first input IN1, a second input IN2, a third input IN3 for receiving a first clock signal, CK, a fourth input IN4 for receiving a second clock signal, XCK, a fifth input IN5 for receiving a first supply voltage, VDD, a sixth input IN6 for receiving a second supply voltage, VSS, and an output OUT for providing an output signal, OUT(N), of the shift register stage $S_N$.

Figure 4:
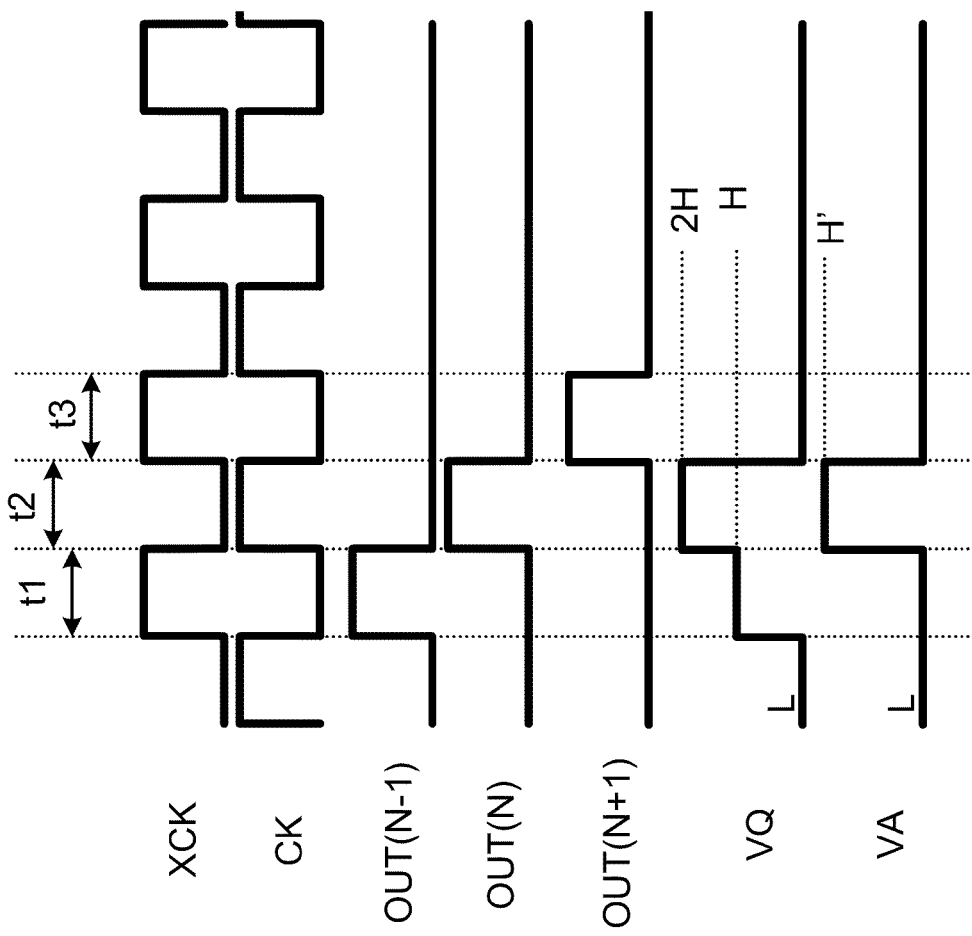
FIG. 4 shows a timing chart of a shift register unit with low power consumption setting inside in the shift register stage according to one embodiment of the present invention.

Each of the first clock signal CK and the second clock signal XCK is characterized with a frequency and a phase, and wherein the frequency of the first clock signal CK and the frequency of the second clock signal XCK are substantially identical, and the phase of the first clock signal CK and the phase of the second clock signal XCK are substantially reversed, i.e., the phase difference between the first clock signal CK and the second clock signal XCK is about 180°, as shown in FIG. 4. Each of the first clock signal CK and the second clock signal XCK has a high voltage and a low voltage. Additionally, the first supply voltage VDD is at a high voltage level, and the second supply voltage VSS is at a low voltage level.

Figure 2:
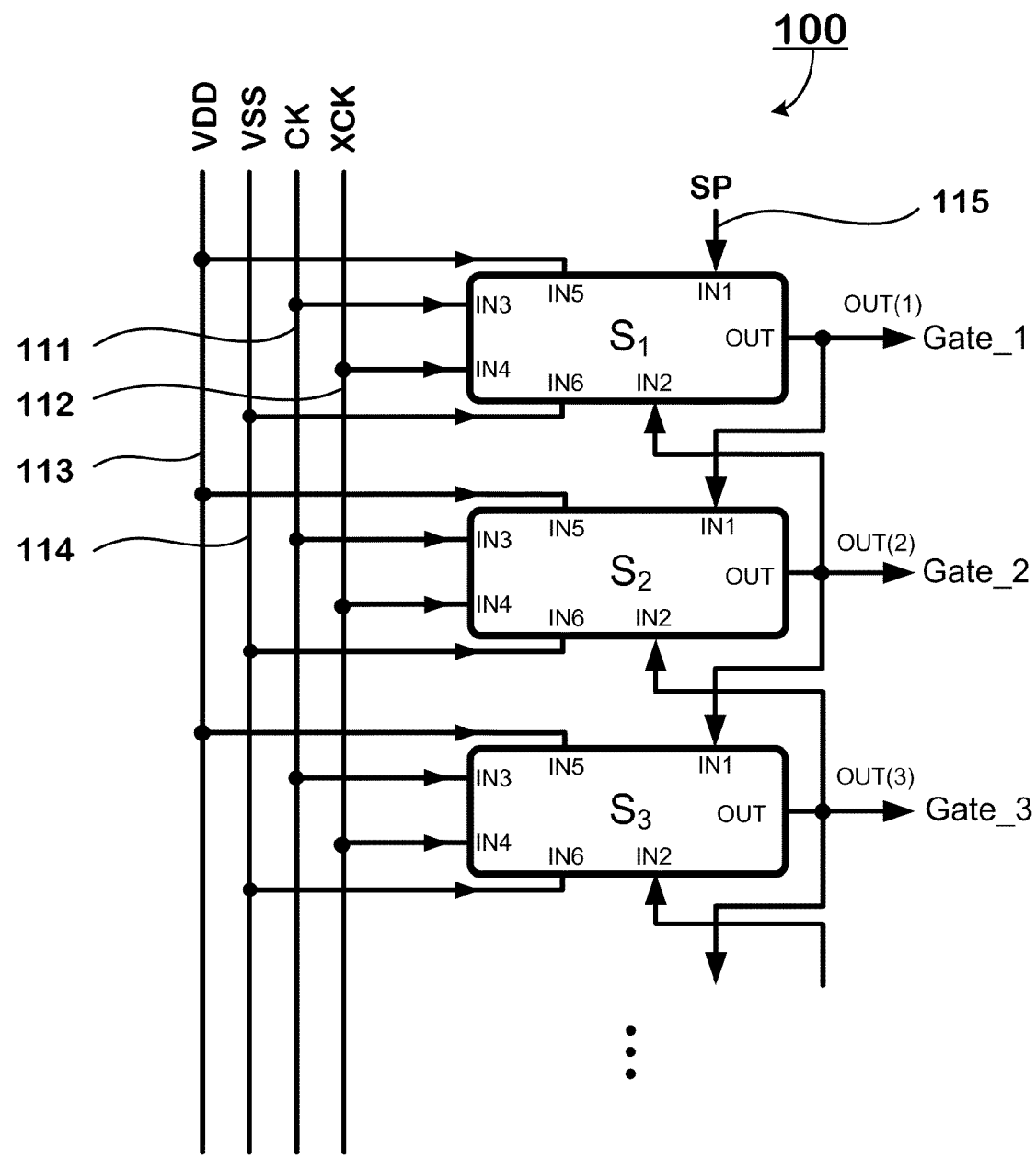
FIG. 2 shows a block diagram of a shift register including a plurality of shift register stages according to one embodiment of the present invention.

As shown in FIG. 2, a shift register 100 having a plurality of shift register stages $\{S_N\}$ is shown according to one embodiment of the present invention, where N=1, 2, 3, . . . M, M is an integer greater than zero. The shift register 100 also includes a start pulse input line 115 for providing a start pulse, SP, a first signal line 111 for providing the first clock signal CLK1, a second signal line 112 for providing the second clock signal CLK2, a third signal line 113 for providing the first supply voltage VDD, and a fourth signal line 114 for providing the second supply voltage VSS.

For each shift register stage $S_N$, the third input IN3 is electrically connected to the first signal line 111 for receiving the first clock signal CK. The fourth input IN4 is electrically connected to the second signal line 112 for receiving the second clock signal XCK. The fifth input IN5 is electrically connected to the third signal line 113 for receiving the first supply voltage VDD. The sixth input IN6 is electrically connected to the fourth signal line 114 for receiving the second supply voltage VSS.

The plurality of shift register stages $\{S_N\}$ is electrically connected to each other in serial such that the first input IN1 of the shift register stage $S_N$ is electrically connected to the output OUT of the (N−1)-th shift register stage $S_{N-1}$ for receiving an output signal OUT(N−1) from the (N−1)-th shift register stage $S_{N-1}$, the second input IN2 of the shift register stage $S_N$ is electrically connected to the output OUT of the (N+1)-th shift register stage $S_{N+1}$ for receiving an output signal OUT(N+1) from the (N+1)-th shift register stage $S_{N+1}$, and the output OUT of the shift register stage $S_N$ is electrically connected to the first input IN1 of the (N+1)-th shift register stage, $S_{N+1}$ for providing the output OUT signal OUT(N+1) thereto. However, the first shift register stage $S_1$, the first input IN1 is electrically connected to the start pulse input line 115 for receiving the start pulse SP.

For example, as shown in FIG. 2, for the first shift register stage $S_1$, the first input IN1 is electrically connected to the start pulse input line 115 for receiving the start pulse SP; the second input IN2 is electrically connected to the output OUT of the second shift register stage $S_2$ for receiving the output signal OUT(2) from the second shift register stage $S_2$; and the output OUT is electrically connected to the first input IN1 of the second shift register stage $S_2$ for providing the output signal OUT(1) to the second shift register stage $S_2$. For the second shift register stage $S_2$, the first input IN1 is electrically connected to the output OUT of the first shift register stage $S_1$ for receiving the output signal OUT(1) from the first shift register stage $S_1$; the second input IN2 is electrically connected to the output OUT of the third shift register stage $S_3$ for receiving an output signal OUT(3) from the third shift register stage $S_3$; and the output OUT is electrically connected to the first input IN1 of the third shift register stage $S_3$ for providing the output signal OUT(2) to the third shift register stage $S_3$, and so on.

Additionally, the output signal OUT(N) of each shift register stage $S_N$ is also electrically coupled to a corresponding gate line, Gate_N, for providing a gate signal to drive the gate line of a display panel such an LCD panel.

Figure 3:
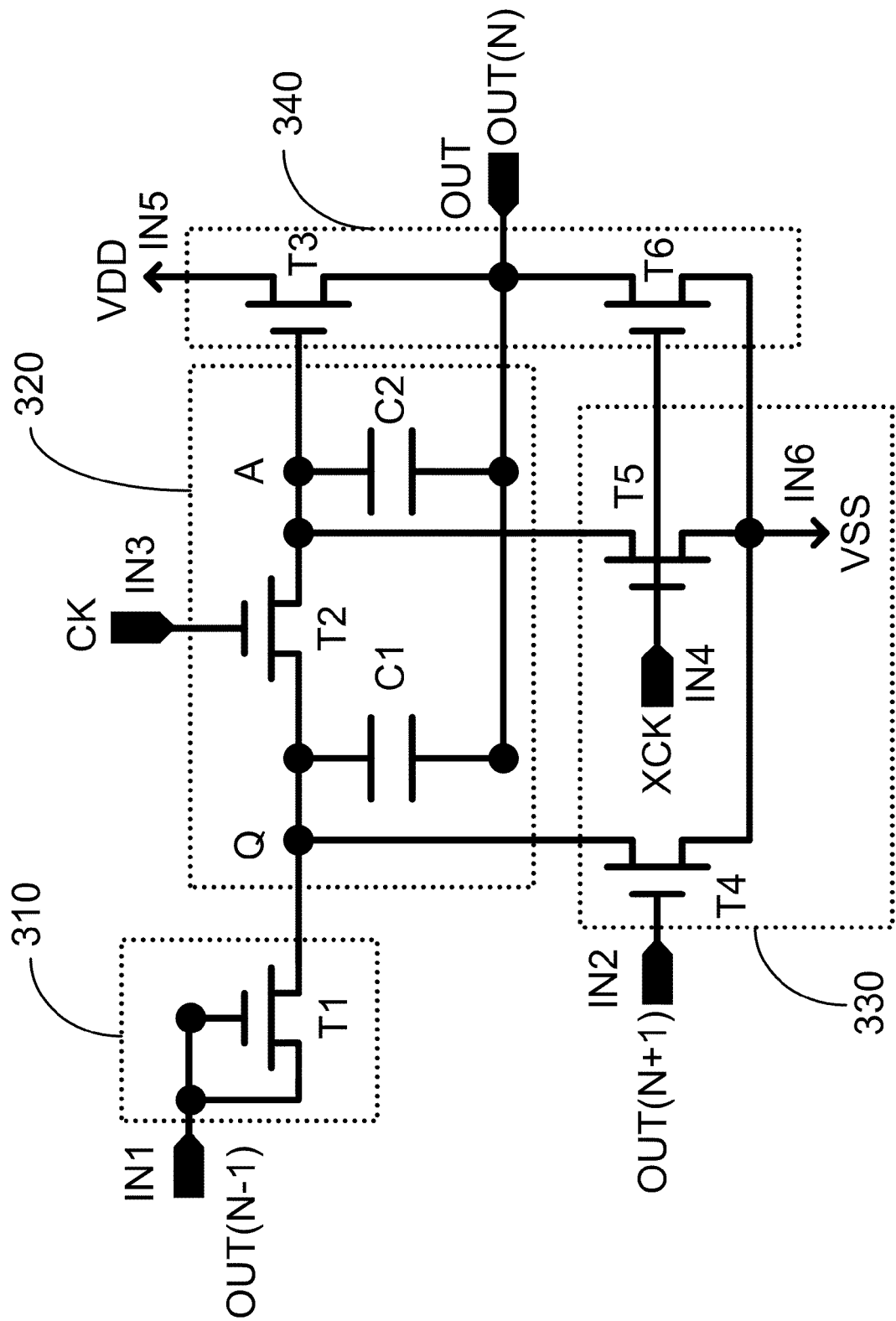
FIG. 3 shows a circuit diagram of a shift register stage according to one embodiment of the present invention.

Referring to FIG. 3, the shift register stages $S_N$ is shown according to one embodiment of the present invention. the shift register stages $S_N$ includes a first transistor T1, a second transistor T2, a third transistor T3, a fourth transistor T4, a fifth transistor T5, a sixth transistor T6, a first capacitor C1 and a second capacitor C2.

The first transistor T1 has a gate electrically connected to the first input IN1, a drain, and a source electrically connected to the gate. The second transistor T2 has a gate electrically connected to the third input IN3, a drain, and a source electrically connected to the drain of the first transistor T1. The third transistor T3 has a gate electrically connected to the drain of the second transistor T2, a drain electrically connected to the fifth input IN5, and a source electrically connected to the output OUT. The fourth transistor T4 has a gate electrically connected to the second input IN2, a drain electrically connected to the drain of the first transistor T1, and a source electrically connected to the sixth input IN6. The fifth transistor T5 having a gate electrically connected to the fourth input IN4, a drain electrically connected to the drain of the second transistor T2, and a source electrically connected to the sixth input IN6. The sixth transistor T6 has a gate electrically connected to the gate of the fifth transistor T5, a drain electrically connected to the output OUT, and a source electrically connected to the sixth input IN6. At least one of the first to sixth transistors T1-T6 is a MOS thin film transistor (TFT). Preferably, all the first to sixth transistors T1-T6 are MOS TFTs.

The first capacitor C1 is electrically connected between the source of the second transistor T2 and the output OUT. The second capacitor C2 is electrically connected between the gate of the third transistor T3 and the output OUT.

For such a configuration, the drain of the third (outputting) transistor T3 is electrically coupled to the high voltage VDD, the source of the third transistor T3 is electrically coupled to the output OUT, and therefore, no coupling effect is brought in. Accordingly, the power consumption is reduced and the unstable outputting wave form can also be avoided. Moreover, no inverter structure is employed in the shift register stage, so that the power consumption can further be reduced.

FIG. 4 shows a timing chart of the shift register stage $S_N$ shown in FIG. 3. In a first interval of time, t1, the output signal OUT(N−1) of the (N−1)-th shift register stage $S_{N-1}$ (for N=1, the output signal OUT(0) is corresponding to the start pulse signal SP) has a high voltage, while the output signal OUT (N+1) of the (N+1)-th shift register stage $S_{N+1}$ has a low voltage. The first clock signal CK has a low voltage, while the second clock signal XCK has a high voltage level in the first interval of time t1. Accordingly, the first transistor T1, the fifth transistor T5 and the sixth transistor T6 are turned on, and the second transistor T2, the third transistor T3 and the fourth transistor T4 are turned off. The current flows from the source to the drain of the first transistor T1, and from the drain to the source of each of the fifth transistor T5 and the sixth transistor T6, respectively. As a result, the node Q is charged to have the voltage VQ at a high voltage level of H, while the node A is discharged to have the voltage VA at a low voltage level of L (L=0, for example). Therefore, the output signal OUT(N) from the output node OUT of the shift register stage $S_N$ is in a low voltage state.

In the second interval of time, t2, the first clock signal CK has the high voltage, while the second clock XCK has the low voltage. Additionally, the output signal OUT(N−1) of the (N−1)-th shift register stage $S_{N-1}$ and the output signal OUT (N+1) of the (N+1)-th shift register stage $S_{N+1}$ have the low voltage. Accordingly, the second transistor T2 and the third transistor T3 are turned on, and the first transistor T1, the fourth transistor T4, the fifth transistor T5 and the sixth transistor T6 are turned off. A current flows from the source to the drain of the second transistor T2. Also a current flows from the drain to the source (the output node OUT) of the third transistor T3. As a result, the node Q is charged to a high voltage level of H, while the node A is charged to a high voltage level of H', thereby, causing the output signal OUT (N) from the output node OUT of the shift register stage $S_N$ to be in a high voltage state. Since the output signal OUT(N) from the output node OUT of the shift register stage $S_N$ is changed from the low voltage to the high voltage, the first and second capacitors C1 and C2 are charged accordingly. As a result, the voltage VQ at the node Q and the voltage VA at the node A are charged to a voltage 2H and a voltage H', respectively. The voltage H' is much higher than the high voltage H.

In the third interval of time, t3, the first clock signal CK has the low voltage, the second clock XCK has the high voltage, the output signal OUT(N−1) of the (N−1)-th shift register stage $S_{N-1}$ has the low voltage, and the output signal OUT (N+1) of the (N+1)-th shift register stage $S_{N+1}$ have the high voltage. Accordingly, the first transistor T1, the second transistor T2 and the third transistor T3 are turned off, while the fourth transistor T4, the fifth transistor T5 and the sixth transistor T6 are turned on. A current flows from the drain to the source of each of the fourth transistor T4, the fifth transistor T5 and the sixth transistor T6. As a result, both of the nodes Q and A are discharged to the low voltage level (L).

Same operation is repeated at each shift register stage of a shift register to produce a plurality of sequentially phase shifted clock signals.

Additionally, as shown in FIG. 3, each shift register stages $S_N$ can also be characterized with an input buffer 310, a pull-up driving circuit 320, a pull-down driving circuit 330 and an output buffer 340 electrically coupled to each other.

In the exemplary embodiment shown in FIG. 3, the input buffer 310 has a first transistor T1 having a gate electrically connected to the first input, a drain, and a source electrically connected to the gate. The pull-up driving circuit 320 has a second transistor T2 having a gate electrically connected to the third input, a drain, and a source electrically connected to the drain of the first transistor T1, a first capacitor C1 electrically connected between the source of the second transistor T2 and the output, and a second capacitor C2 electrically connected between the drain of the second transistor T2 and the output. The pull-down driving circuit 330 has a fourth transistor T4 having a gate electrically connected to the second input, a drain electrically connected to the source of the second transistor T2, and a source electrically connected to the sixth input, and a fifth transistor T5 having a gate electrically connected to the fourth input, a drain electrically connected to the drain of the second transistor T2, and a source electrically connected to the sixth input. The output buffer 340 has a third transistor T3 having a gate electrically connected to the drain of the second transistor T2, a drain electrically connected to the fifth input, and a source electrically connected to the output, and a sixth transistor T6 having a gate electrically connected to the gate of the fifth transistor T5, a drain electrically connected to the output, and a source electrically connected to the source of the fifth transistor T5.

Figure 5:
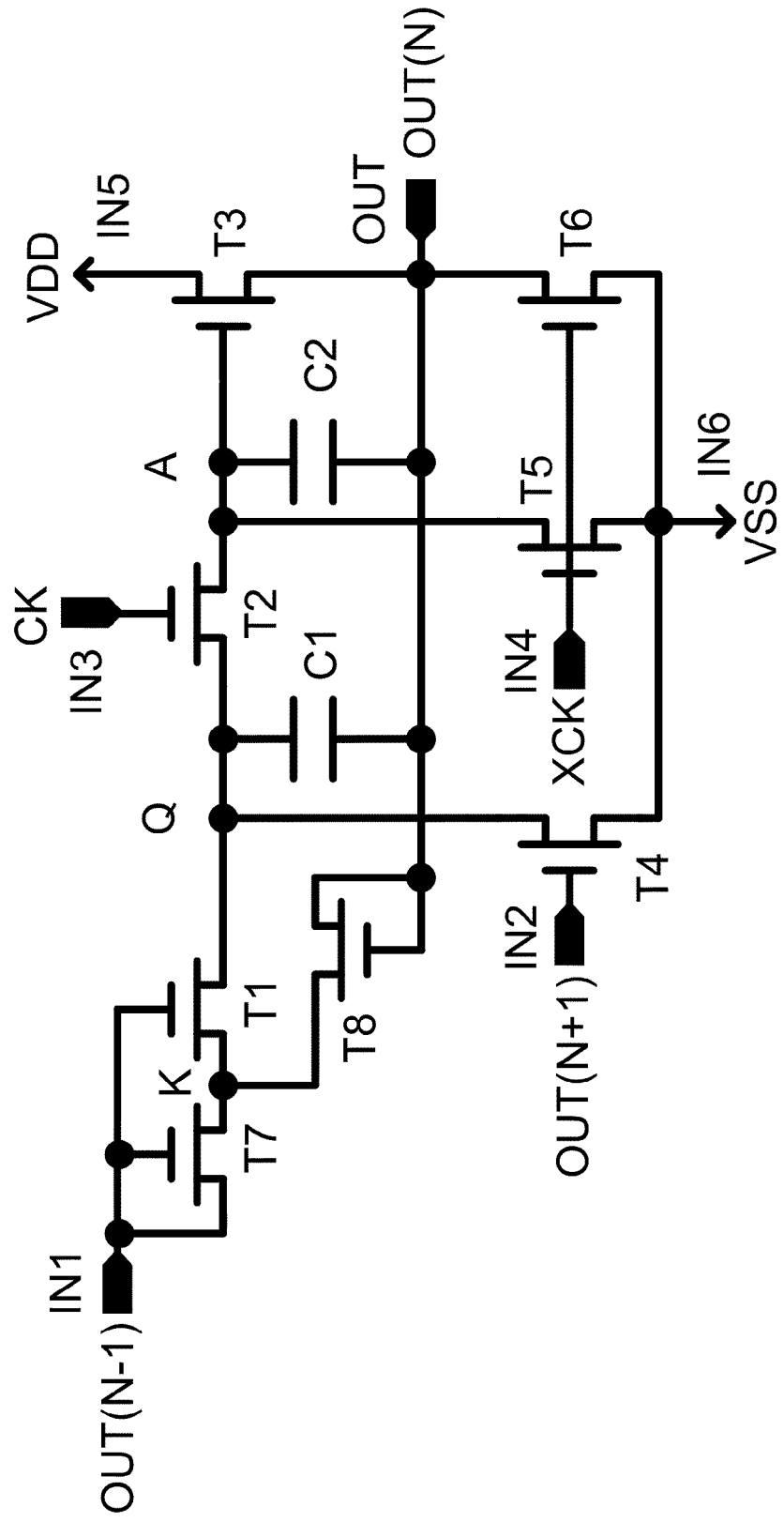
FIG. 5 shows a circuit diagram of a shift register stage according to another embodiment of the present invention.

Referring to FIG. 5, the shift register stages $S_N$ is shown according to another embodiment of the present invention. the shift register stages $S_N$ includes a first transistor T1, a second transistor T2, a third transistor T3, a fourth transistor T4, a fifth transistor T5, a sixth transistor T6, a seven th transistor T7, a eighth transistor T8, a first capacitor C1 and a second capacitor C2.

The first transistor T1 has a gate, a drain, and a source electrically connected to the gate. The second transistor T2 has a gate electrically connected to the third input IN3, a drain, and a source electrically connected to the drain of the first transistor T1. The third transistor T3 has a gate electrically connected to the drain of the second transistor T2, a drain electrically connected to the fifth input IN5, and a source electrically connected to the output OUT. The fourth transistor T4 has a gate electrically connected to the second input IN2, a drain electrically connected to the drain of the first transistor T1, and a source electrically connected to the sixth input IN6. The fifth transistor T5 has a gate electrically connected to the fourth input IN4, a drain electrically connected to the drain of the second transistor T2, and a source electrically connected to the sixth input IN6. The sixth transistor T6 has a gate electrically connected to the gate of the fifth transistor T5, a drain electrically connected to the output OUT, and a source electrically connected to the sixth input IN6. The seventh transistor T7 has a gate electrically connected to the gate of the first transistor T1, a drain electrically connected to the source of the first transistor T1, and a source electrically connected to the first input IN1. The eighth transistor T8 has a gate electrically connected to the output OUT, a drain electrically connected to the source of the first transistor T1, and a source electrically connected to the gate.

The first capacitor C1 electrically connected between the source of the second transistor T2 and the output OUT. The second capacitor C2 electrically connected between the gate of the third transistor T3 and the output OUT.

As such a configuration, the drain of the third (outputting) transistor T3 is electrically coupled to the high voltage VDD, the source of the outputting transistor T3 is electrically coupled to the output node OUT. Therefore, no coupling effect is introduced so that the power consumption of the shift register stage is reduced. And the unstable outputting wave form can be avoided. Moreover, no inverter structure is employed, so the power consumption is further reduced.

Additionally, the seventh transistor T7 and the eighth transistor T8 are adapted for preventing the leakage current due to the high voltage between the source and the drain of the first transistor T1. The configuration of the seventh transistor T7 and the eighth transistor T8 shown in FIG. 5 is usually called a voltage clamping module. The voltage clamping module may be formed with other structure used to clamp the voltage drop between the source and drain of a transistor.

In one embodiment, at least one of transistors T1-T8 is a MOS thin film transistor. Preferably, all transistors T1-T8 are MOS thin film transistors.

The operation of the shift register stage $S_N$ is illustrated in the form of the time chart shown in FIG. 4. In a first interval of time, t1, the output signal OUT(N−1) of the (N−1)-th shift register stage $S_{N-1}$ (for N=1, the output signal OUT(0) is corresponding to the start pulse signal SP) has a high voltage, while the output signal OUT(N+1) of the (N+1)-th shift register stage $S_{N+1}$ has a low voltage. The first clock signal CK has a low voltage, while the second clock signal XCK has a high voltage level in the first interval of time t1. Accordingly, the first transistor T1, the fifth transistor T5, the sixth transistor T6 and the seventh transistor T7 are turned on, while the second transistor T2, the third transistor T3, the fourth transistor T4 and the eighth transistor T8 are turned off. A first current flows from the source to the drain of the seventh transistor T7, and then flows from the source to the drain of the first transistor T1. A second current flows from the drain to the source of the fifth transistor T5. A third current flows from the drain to the source of the sixth transistor T6, respectively. As a result, the node Q is charged to have the voltage VQ at a high voltage level (H), while the node A is discharged to have the voltage VA at a low voltage level (L). Therefore, the output signal OUT(N) from the output node OUT of the shift register stage $S_N$ is in a low voltage state.

In the second interval of time, t2, the first clock signal CK has a high voltage, while the second clock XCK has a low voltage. Additionally, the output signal OUT(N−1) of the (N−1)-th shift register stage $S_{N-1}$ and the output signal OUT(N+1) of the (N+1)-th shift register stage $S_{N+1}$ have the low voltage. Accordingly, the second transistor T2, the third transistor T3 and the eighth transistor T8 are turned on, while the first transistor T1, the fourth transistor T4, the fifth transistor T5 and the sixth transistor T6, the seventh transistor T7 are turned off. A first current flows from the source to the drain of the second transistor T2. Also, a second current flows from the drain to the source (the output node OUT) of the third transistor T3. The current also flows from the output node OUT through the source to the drain of the eighth transistor T8. As a result, the node Q is charged to a high voltage 2H, while the node A is charged to a high voltage H', thereby, causing the output signal OUT(N) from the output node OUT of the shift register stage $S_N$ to be in a high voltage state. Additionally, the node K is also charged to have a high voltage H. Since the output signal OUT(N) from the output node OUT of the shift register stage $S_N$ is changed from the low voltage to the high voltage, the first and second capacitors C1 and C2 are charged accordingly. As a result, the voltage VQ at the node Q and the voltage VA at the node A are charged to a voltage 2H and a voltage H', respectively. The voltage H' is much higher than the high voltage H. As the voltage at the node K is kept at a high voltage level of H and the voltage at the node Q is kept at a high voltage level of 2H, the voltage drop (difference) between the source and the drain of the first transistor T1 is about (2H−H)=H.

In other words, by including the seventh transistor T7 and the eighth transistor T8, the voltage difference between the source and the drain of the first transistor T1 is about (2H−H)=H. However, without the seventh transistor T7 and the eighth transistor T8, as shown in FIG. 3, the voltage difference between the source and the drain of the first transistor T1 is about (2H−L)=2H. Therefore, the function of the seventh transistor T7 and the eighth transistor T8 is to prevent the leakage current due to the high voltage between the source and the drain of the first transistor T1.

In the third interval of time, t3, the first clock signal CK has the low voltage, the second clock XCK has the high voltage, the output signal OUT(N−1) of the (N−1)-th shift register stage $S_{N-1}$ has the low voltage, and the output signal OUT(N+1) of the (N+1)-th shift register stage $S_{N+1}$ have the high voltage. Accordingly, the first transistor T1, the second transistor T2, the third transistor T3, the seventh transistor T7 and the eighth transistor T8 are turned off, while the fourth transistor T4, the fifth transistor T5 and the sixth transistor T6 are turned on. The current flows from the drain to the source of each of the fourth transistor T4, the fifth transistor T5 and the sixth transistor T6. As a result, both of the nodes Q and A are discharged to the low voltage level (L).

Figure 6:
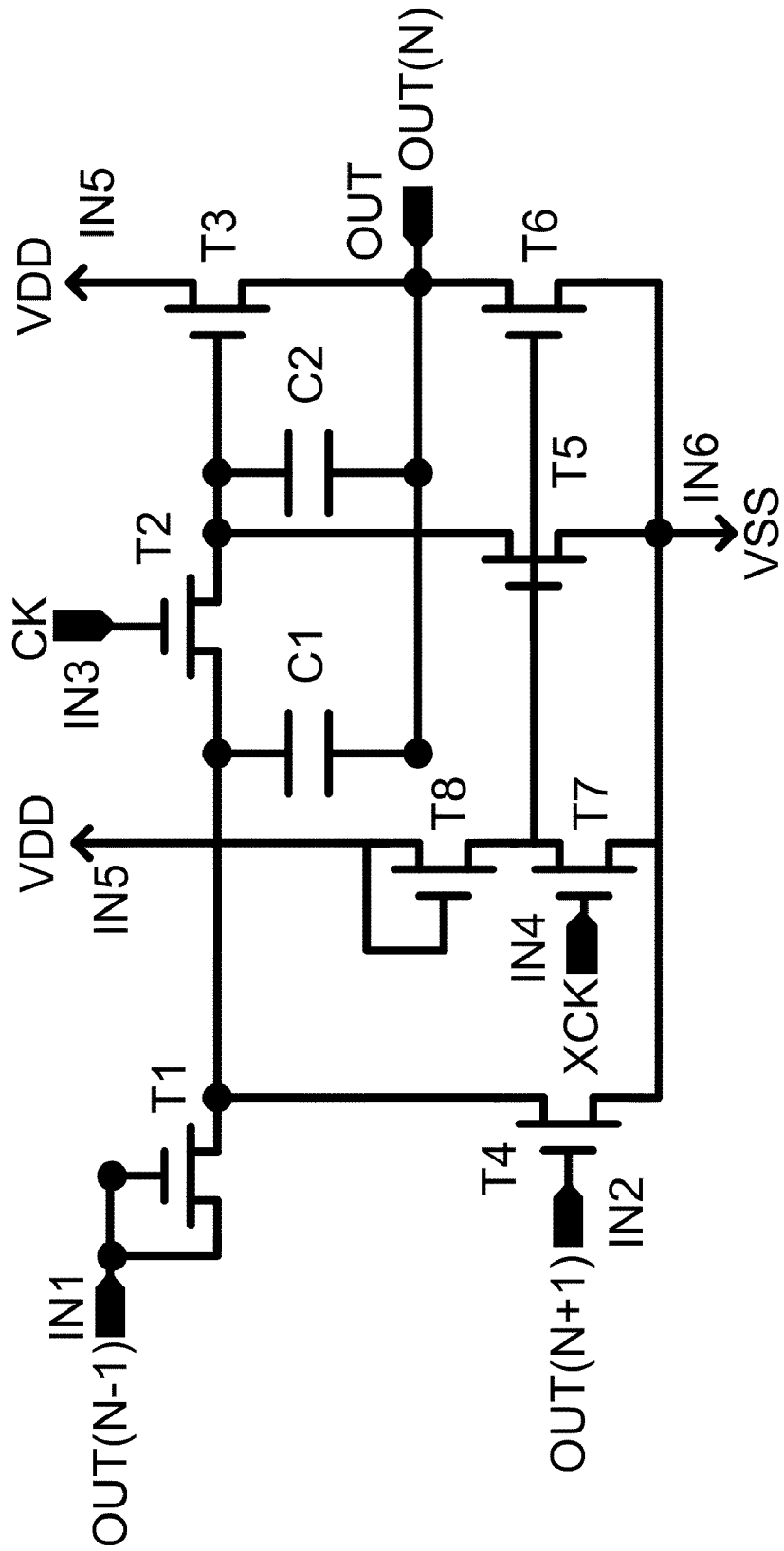
FIG. 6 shows a circuit diagram of a shift register stage according to yet another embodiment of the present invention.

Referring to FIG. 6, the shift register stages $S_N$ is shown according to yet another embodiment of the present invention. The shift register stage $S_N$ includes a first transistor T1 having a gate electrically connected to the first input IN1, a drain, and a source electrically connected to the gate, a second transistor T2 having a gate electrically connected to the third input IN3, a drain, and a source electrically connected to the drain of the first transistor T1, a third transistor T3 having a gate electrically connected to the drain of the second transistor T2, a drain electrically connected to the fifth input IN5, and a source electrically connected to the output OUT, a fourth transistor T4 having a gate electrically connected to the second input IN2, a drain electrically connected to the drain of the first transistor T1, and a source electrically connected to the sixth input IN6, a fifth transistor T5 having a gate, a drain electrically connected to the drain of the second transistor T2, and a source electrically connected to the sixth input IN6, a sixth transistor T6 having a gate electrically connected to the gate of the fifth transistor T5, a drain electrically connected to the output OUT, and a source electrically connected to the sixth input IN6, a seventh transistor T7 having a gate electrically connected to the fourth input IN4, a drain electrically connected to gate of the fifth transistor T5, and a source electrically connected to the source of the fifth transistor T5, and an eighth transistor T8 having a gate, a drain electrically connected to the source of the seventh transistor T7, and a source electrically connected to the gate and the fifth input IN5.

Figure 7:
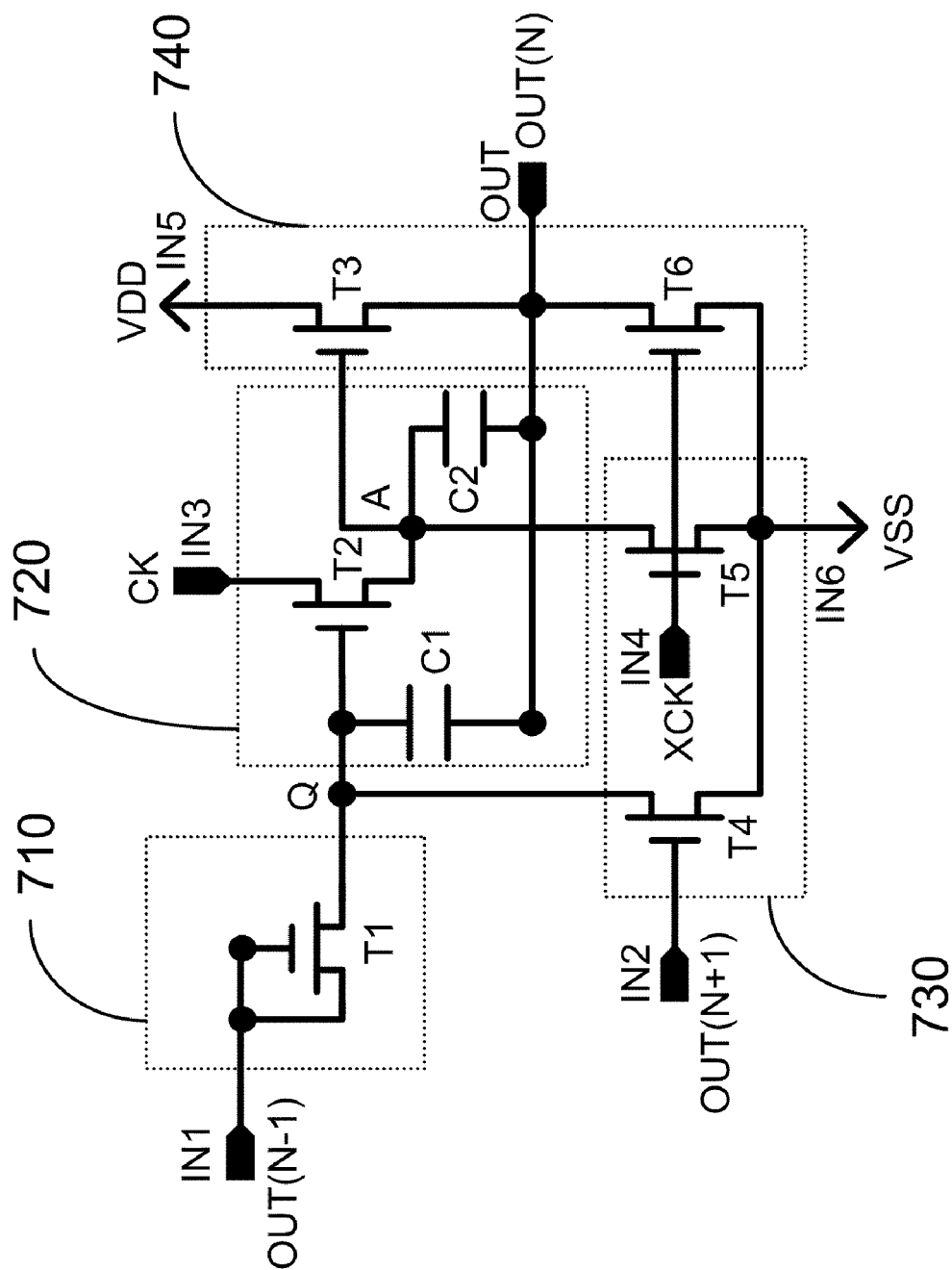
FIG. 7 shows a circuit diagram of a shift register stage according to one embodiment of the present invention.

The shift register stage $S_N$ also includes a first capacitor C1 electrically connected between the source of the second transistor T2 and the output OUT, and a first capacitor C1 electrically connected between the source of the second transistor T2 and the output OUT FIG. 7 shows an alternative embodiment of the shift register stages $S_N$ according to the present invention. The shift register stages $S_N$ includes six transistors T1-T6 and two capacitors, C1 and C2. The first transistor T1 has a gate electrically connected to the first input, a drain, and a source electrically connected to the gate. The second transistor T2 has a gate electrically connected to the drain of the first transistor T1, a drain electrically connected to the third input, and a source. The third transistor T3 has a gate electrically connected to the source of the second transistor T2, a drain electrically connected to the fifth input, and a source electrically connected to the output. The fourth transistor T4 has a gate electrically connected to the second input, a drain electrically connected to the drain of the first transistor T1, and a source electrically connected to the sixth input. The fifth transistor T5 has a gate electrically connected to the fourth input, a drain electrically connected to the source of the second transistor T2, and a source electrically connected to the sixth input. The sixth transistor T6 has a gate electrically connected to the gate of the fifth transistor T5, a drain electrically connected to the output OUT, and a source electrically connected to the sixth input. The first capacitor C1 is electrically connected between the gate of the second transistor T2 and the output. The second capacitor C2 electrically connected between the gate of the third transistor T3 and the output.

Additionally, as shown in FIG. 7, the shift register stages $S_N$ can also be characterized with an input buffer 710, a pull-up driving circuit 720, a pull-down driving circuit 730 and an output buffer 740 electrically coupled to each other.

In the exemplary embodiment shown in FIG. 7, the input buffer 710 has a first transistor T1 having a gate electrically connected to the first input, a drain, and a source electrically connected to the gate.

The pull-up driving circuit 720 includes a second transistor T2 having a gate electrically connected to the drain of the first transistor T1, a drain electrically connected to the third input, and a source electrically connected to the gate of the third transistor T3, a first capacitor C1 electrically connected between the gate of the second transistor T2 and the output, and a second capacitor C2 electrically connected between the source of the second transistor T2 and the output.

The pull-down driving circuit 730 includes a fourth transistor T4 having a gate electrically connected to the second input, a drain electrically connected to the drain of the first transistor T1, and a source electrically connected to the sixth input; and a fifth transistor T5 having a gate electrically connected to the fourth input, a drain electrically connected to the source of the second transistor T2, and a source electrically connected to the sixth input.

The he output buffer 740 has a third transistor T3 having a gate electrically connected to the source of the second transistor T2, a drain electrically connected to the fifth input, and a source electrically connected to the output; and a sixth transistor T6 having a gate electrically connected to the gate of the fifth transistor T5, a drain electrically connected to the output, and a source electrically connected to the source of the fifth transistor T5.

Figure 8:
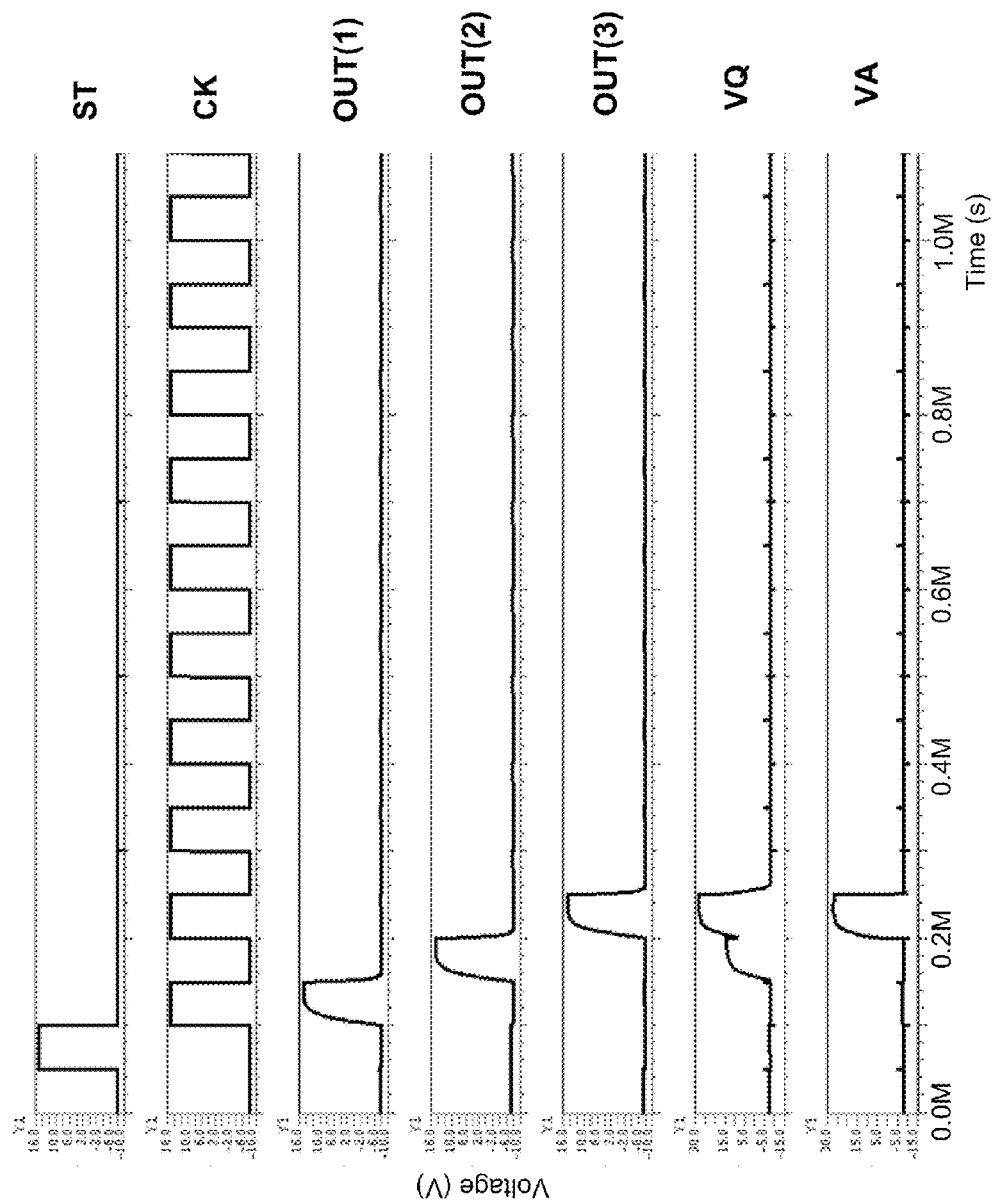
FIG. 8 shows a simulated timing chart of a shift register according to one embodiment of the present invention.
Figure 9:
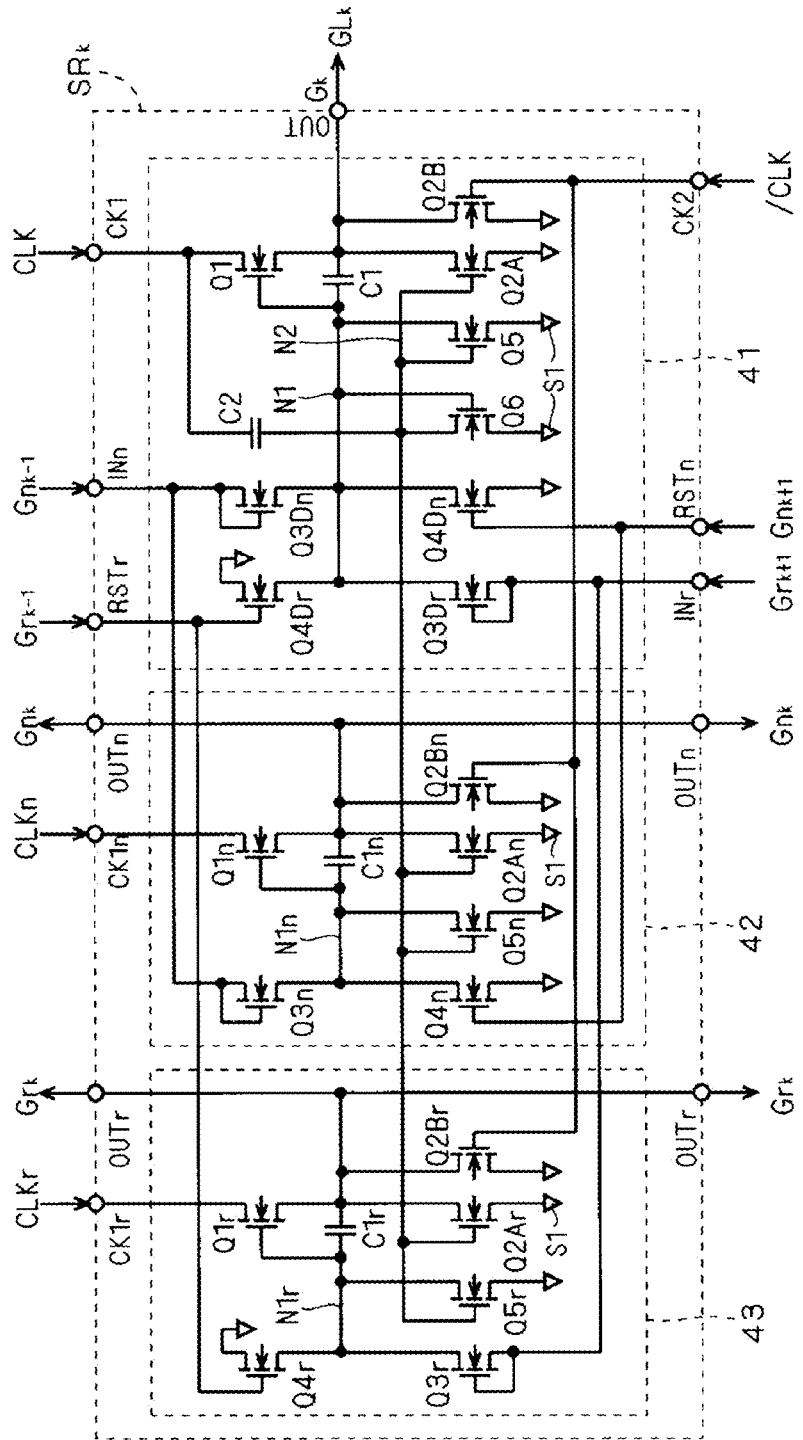
FIG. 9 shows a conventional bidirectional shift register.
Figure 10:
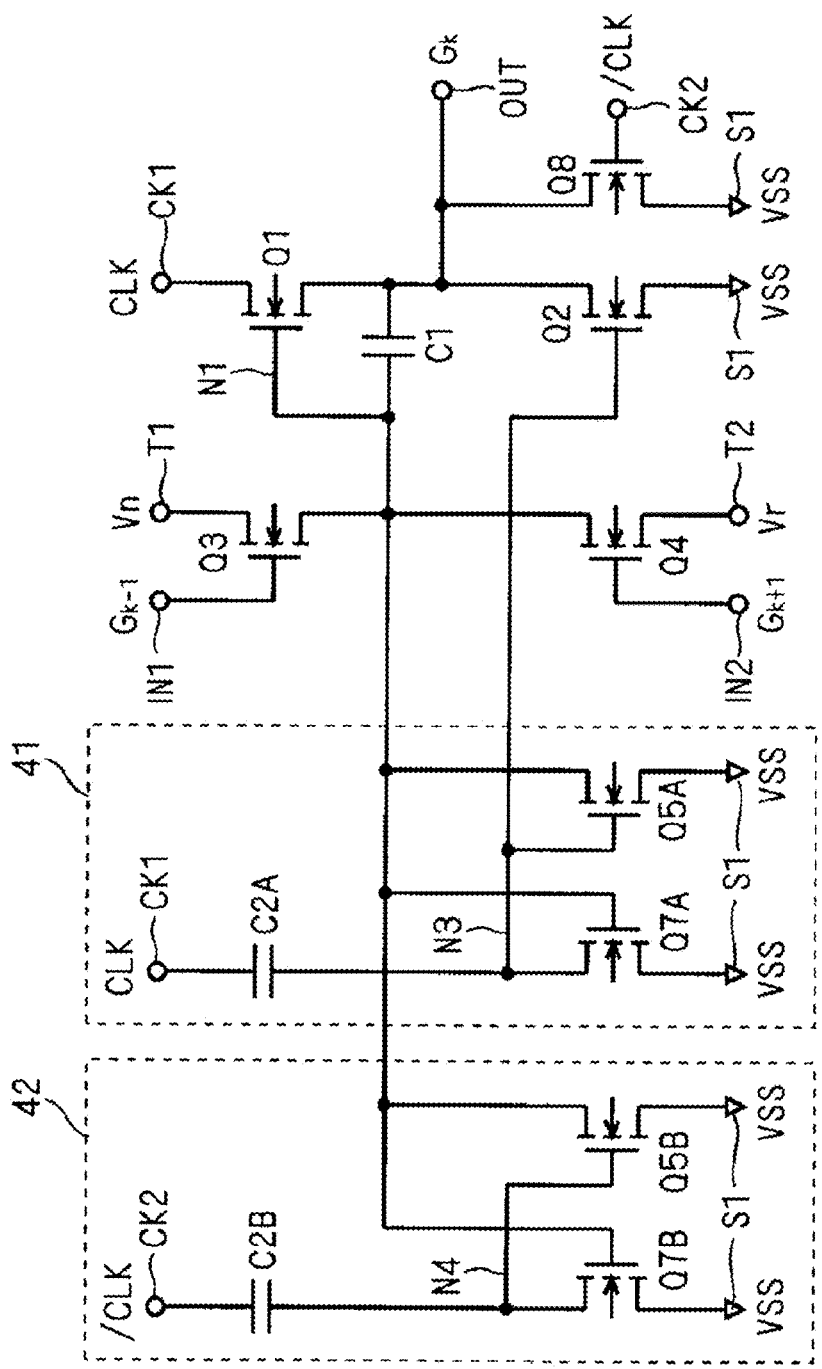
FIG. 10 shows another conventional bidirectional shift register.

FIG. 8 shows timing charts of simulated stage output signals OUT(1), OUT(2) and OUT(3), the simulated voltages VQ and VA at the node Q and A, respectively.

In sum, the present invention, among other things, recites a shift register having a plurality of shift register stages. Each shift register stage is configured such that the drain of the third (outputting) transistor T3 is electrically coupled to the high voltage VDD, the source of the outputting transistor T3 is electrically coupled to the output node OUT. Therefore, no coupling effect is introduced so that the power consumption of the shift register stage is reduced. And the unstable outputting wave form can be avoided. Moreover, no inverter structure is employed, so the power consumption is further reduced.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A shift register comprising a plurality of shift register stages $\{S_N\}$, N=1, 2, . . . , M, M being a nonzero positive integer, wherein each of the plurality of shift register stages, $S_N$, comprises:
    (a) a first input;
    (b) a second input;
    (c) a third input for receiving a first clock signal, CK;
    (d) a fourth input for receiving a second clock signal, XCK;
    (e) a fifth input for receiving a first supply voltage, VDD;
    (f) a sixth input for receiving a second supply voltage, VSS;
    (g) an output for providing an output signal, OUT(N), therefrom;
    (h) a first transistor T1 having a gate electrically connected to the first input, a drain, and a source electrically connected to the gate;
    (i) a second transistor T2 having a gate electrically connected to the third input, a drain, and a source electrically connected to the drain of the first transistor T1;
    (j) a third transistor T3 having a gate electrically connected to the drain of the second transistor T2, a drain electrically connected to the fifth input, and a source electrically connected to the output;
    (k) a fourth transistor T4 having a gate electrically connected to the second input, a drain electrically connected to the drain of the first transistor T1, and a source electrically connected to the sixth input;
    (l) a fifth transistor T5 having a gate electrically connected to the fourth input, a drain electrically connected to the drain of the second transistor T2, and a source electrically connected to the sixth input;
    (m) a sixth transistor T6 having a gate electrically connected to the gate of the fifth transistor T5, a drain electrically connected to the output OUT, and a source electrically connected to the sixth input;
    (n) a first capacitor C1 electrically connected between the source of the second transistor T2 and the output; and
    (o) a second capacitor C2 electrically connected between the gate of the third transistor T3 and the output.

2. The shift register of claim 1, wherein the plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

3. The shift register of claim 1, wherein at least one of the first to sixth transistors T1-T6 comprises a MOS thin film transistor.

4. The shift register of claim 1, wherein each of the first clock signal CK and the second clock signal XCK is characterized with a frequency and a phase, and wherein the frequency of the first clock signal CK is identical to that of the second clock signal XCK, and the phase difference between the first clock signal CK and the second clock signal XCK is about 180°.

5. The shift register of claim 1, wherein the first supply voltage VDD is at a high voltage level, and the second supply voltage VSS is at a low voltage level.

6. A shift register comprising a plurality of shift register stages $\{S_N\}$, N=1, 2, . . . , M, M being a nonzero positive integer, wherein each of the plurality of shift register stages, $S_N$, comprises:
   (a) a first input;
   (b) a second input;
   (c) a third input for receiving a first clock signal, CK;
   (d) a fourth input for receiving a second clock signal, XCK;
      a fifth input for receiving a first power supply, VDD; a sixth input for receiving a second power supply, VSS;
   (e) an output for providing an output signal, OUT(N), therefrom; and
   (f) a first transistor T1 having a gate electrically connected to the first input, a drain, and a source;
   (g) a second transistor T2 having a gate electrically connected to the third input, a drain, and a source electrically connected to the drain of the first transistor T1;
   (h) a third transistor T3 having a gate electrically connected to the drain of the second transistor T2, a drain electrically connected to the fifth input, and a source electrically connected to the output;
   (i) a fourth transistor T4 having a gate electrically connected to the second input, a drain electrically connected to the drain of the first transistor T1, and a source electrically connected to the sixth input;
   (j) a fifth transistor T5 having a gate, a drain electrically connected to the drain of the second transistor T2, and a source electrically connected to the sixth input;
   (k) a sixth transistor T6 having a gate electrically connected to the gate of the fifth transistor T5, a drain electrically connected to the output OUT, and a source electrically connected to the sixth input;
   (l) a first capacitor C1 electrically connected between the source of the second transistor T2 and the output; and
   (m) a second capacitor C2 electrically connected between the gate of the third transistor T3 and the output,
   wherein the plurality of stages $\{S_N\}$ is electrically connected to each other in serial such that the first input of the shift register stage $S_N$ is electrically connected to the output of the (N−1)-th shift register stage $S_{N−1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

7. The shift register of claim 6, wherein each of the first clock signal CK and the second clock signal XCK is characterized with a frequency and a phase, and wherein the frequency of the first clock signal CK is identical to that of the second clock signal XCK, and the phase difference between the first clock signal CK and the second clock signal XCK is about 180°.

8. The shift register of claim 6, wherein the first supply voltage VDD is at a high voltage level, and the second supply voltage VSS is at a low voltage level.

9. The shift register of claim 6, wherein the source of the first transistor T1 is electrically connected to the gate of the first transistor T1, and wherein the gate of the fifth transistor T5 is electrically connected to the fourth input.

10. The shift register of claim 6, wherein each shift register stage SN further comprises:
   (a) a seventh transistor T7 having a gate electrically connected to the gate of the first transistor T1, a drain electrically connected to the source of the first transistor T1, and a source electrically connected to the first input; and
   (b) an eighth transistor T8 having a gate electrically connected to the output OUT, a drain electrically connected to the source of the first transistor T1, and a source electrically connected to the gate.

11. The shift register of claim 6, wherein each shift register stage $S_N$ further comprises:
   (a) a seventh transistor T7 having a gate electrically connected to the fourth input, a drain electrically connected to gate of the fifth transistor T5, and a source electrically connected to the source of the fifth transistor T5; and
   (b) an eighth transistor T8 having a gate, a drain electrically connected to the source of the seventh transistor T7, and a source electrically connected to the gate and the fifth input.

12. A shift register comprising a plurality of shift register stages $\{S_N\}$, N=1, 2, . . . , M, M being a nonzero positive integer, wherein each of the plurality of shift register stages, $S_N$, comprises:
   (a) a first input;
   (b) a second input;
   (c) a third input for receiving a first clock signal, CK;
   (d) a fourth input for receiving a second clock signal, XCK;
   (e) a fifth input for receiving a first supply voltage, VDD;
   (f) a sixth input for receiving a second supply voltage, VSS;
   (g) an output for providing an output signal, OUT(N), therefrom;
   (h) an input buffer electrically coupled to the first input;
   (i) a pull-up driving circuit electrically coupled to the third input, the input buffer and the output;
   (j) a pull-down driving circuit electrically coupled to the second, fourth and sixth inputs and the pull-up driving circuit; and
   (k) an output buffer electrically coupled to the fifth input, the pull-up driving circuit, the pull-down driving circuit and the output,
   wherein the input buffer comprises:
      a first transistor T1 having a gate electrically connected to the first input, a drain, and a source electrically connected to the gate;
   wherein the pull-down driving circuit comprises:
      a fourth transistor T4 having a gate electrically connected to the second input, a drain electrically connected to the drain of the first transistor T1, and a source electrically connected to the sixth input; and
      a fifth transistor T5 having a gate electrically connected to the fourth input, a drain, and a source electrically connected to the sixth input; and wherein the output buffer comprises:
- a third transistor T3 having a gate, a drain electrically connected to the fifth input, and a source electrically connected to the output; and
- a sixth transistor T6 having a gate electrically connected to the gate of the fifth transistor T5, a drain electrically connected to the output, and a source electrically connected to the source of the fifth transistor T5.

13. The shift register of claim 12, wherein the plurality of stages $\{S_N\}$ is electrically connected to each other in serial such that the first input of the shift register stage $S_N$ is electrically connected to the output of the (N−1)-th shift register stage $S_{N-1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

14. The shift register of claim 12, wherein the pull-up driving circuit comprises:
(a) a second transistor T2 having a gate electrically connected to the third input, a drain electrically connected to the gate of the third transistor T3, and a source electrically connected to the drain of the first transistor T1;
(b) a first capacitor C1 electrically connected between the source of the second transistor T2 and the output; and
(c) a second capacitor C2 electrically connected between the drain of the second transistor T2 and the output.

15. The shift register of claim 12, wherein the pull-up driving circuit comprises:
(a) a second transistor T2 having a gate electrically connected to the drain of the first transistor T1, a drain electrically connected to the third input, and a source electrically connected to the gate of the third transistor T3;
(b) a first capacitor C1 electrically connected between the gate of the second transistor T2 and the output; and
(c) a second capacitor C2 electrically connected between the source of the second transistor T2 and the output.

16. A shift register comprising a plurality of shift register stages $\{S_N\}$, N=1, 2, ..., M, M being a nonzero positive integer, wherein each of the plurality of shift register stages, $S_N$, comprises:
(a) a first input;
(b) a second input;
(c) a third input for receiving a first clock signal, CK;
(d) a fourth input for receiving a second clock signal, XCK;
(e) a fifth input for receiving a first supply voltage, VDD;
(f) a sixth input for receiving a second supply voltage, VSS;
(g) an output for providing an output signal, OUT(N), therefrom;
(h) a first transistor T1 having a gate electrically connected to the first input, a drain, and a source electrically connected to the gate;
(i) a pull-up driving circuit comprising:
a first capacitor C1 having a first terminal electrically connected to the drain of the first transistor T1 and a second terminal electrically connected to the output; and
a second capacitor C2 having a first terminal and a second terminal electrically connected to the output; and
a second transistor T2 having a gate electrically connected to the third input, a drain electrically connected to the first terminal of the second capacitor C2, and a source electrically connected to the first terminal of the first capacitor C1;
(j) a pull-down driving circuit electrically coupled to the second, fourth and sixth inputs and the pull-up driving circuit; and
(k) an output buffer electrically coupled to the fifth input, the pull-up driving circuit, the pull-down driving circuit and the output.

17. The shift register of claim 16, wherein the plurality of stages $\{S_N\}$ is electrically connected to each other in serial such that the first input of the shift register stage $S_N$ is electrically connected to the output of the (N−1)-th shift register stage $S_{N+1}$ for receiving an output signal OUT(N−1) therefrom, the second input of the shift register stage $S_N$ is electrically connected to the output of the (N+1)-th shift register stage $S_{N+1}$ for receiving an output signal OUT(N+1) therefrom, and the output of the shift register stage $S_N$ is electrically connected to the first input of the (N+1)-th shift register stage, $S_{N+1}$ for providing the output signal OUT(N+1) thereto.

18. The shift register of claim 16, wherein the pull-down driving circuit comprises:
(a) a fourth transistor T4 having a gate electrically connected to the second input, a drain electrically connected to the drain of the first transistor T1, and a source electrically connected to the sixth input; and
(b) a fifth transistor T5 having a gate electrically connected to the fourth input, a drain electrically connected to the first terminal of the second capacitor C2, and a source electrically connected to the sixth input.

19. A shift register comprising a plurality of shift register stages $\{S_N\}$, N=1, 2, ... M, M being a nonzero positive integer, wherein each of the plurality of shift register stages, $S_N$, comprises:
(a) a first input;
(b) a second input;
(c) a third input for receiving a first clock signal, CK;
(d) a fourth input for receiving a second clock signal, XCK;
(e) a fifth input for receiving a first supply voltage, VDD;
(f) a sixth input for receiving a second supply voltage, VSS;
(g) an output for providing an output signal, OUT(N), therefrom;
(h) a first transistor T1 having a gate electrically connected to the first input, a drain, and a source electrically connected to the gate;
(i) a pull-up driving circuit comprising:
a first capacitor C1 having a first terminal electrically connected to the drain of the first transistor T1 and a second terminal electrically connected to the output; and
a second capacitor C2 having a first terminal and a second terminal electrically connected to the output;
(j) a pull-down driving circuit electrically coupled to the second, fourth and sixth inputs and the pull-up driving circuit; and
(k) an output buffer electrically coupled to the fifth input, the pull-up driving circuit, the pull-down driving circuit and the output, comprising:
a third transistor T3 having a gate electrically connected to the first terminal of the second capacitor C2, a drain electrically connected to the fifth input, and a source electrically connected to the output; and
a sixth transistor T6 having a gate electrically connected to the fourth input, a drain electrically connected to the output, and a source electrically connected to the sixth input.

* * * * *